United States Patent [19]

Kutscher et al.

[11] Patent Number: 5,017,780

[45] Date of Patent: May 21, 1991

[54] ION REFLECTOR

[76] Inventors: Roland Kutscher, Dresdener Str. 6, D-6301 Biebertal; Raimund Grix, Waldstr. 2, D-6307 Linden; Gangqiang Li, Hammstr. 8, D-6300 Giessen; Hermann Wollnik, Auf der Platte 30, D-6301 Fernwald 2, all of Fed. Rep. of Germany

[21] Appl. No.: 409,671

[22] Filed: Sep. 20, 1989

[51] Int. Cl.[5] ........................ H01J 37/47; H01J 49/40

[52] U.S. Cl. ................................ 250/287; 250/396 R

[58] Field of Search .................... 250/281, 287, 396 R, 250/397, 423 R

[56] References Cited

U.S. PATENT DOCUMENTS

| | | | |
|---|---|---|---|
| 3,727,047 | 4/1973 | Janes | 250/287 |
| 4,072,862 | 2/1978 | Mamyrin et al. | 250/287 |
| 4,330,708 | 5/1982 | Meisburger | 250/396 R |
| 4,468,564 | 8/1984 | Boyer | 250/427 |
| 4,568,833 | 2/1986 | Roelofs | 250/396 R |
| 4,625,112 | 11/1986 | Yoshida | 250/287 |
| 4,633,084 | 12/1986 | Gruen et al. | 250/306 |
| 4,731,532 | 3/1988 | Frey et al. | 250/287 |

FOREIGN PATENT DOCUMENTS

| | | | |
|---|---|---|---|
| 956450 | 1/1957 | Fed. Rep. of Germany | 250/287 |

*Primary Examiner*—Bruce C. Anderson

*Attorney, Agent, or Firm*—Flehr, Hohbach, Test, Albritton & Herbert

[57] ABSTRACT

The invention covers novel ion reflectors which are conceived principally for use in time-of-flight mass spectrometry. Caused by special electrodes of conical construction, such ion reflectors also have special ion-optical properties which are made possible through optimum compensation of the spherical and chromatic aberrations both of the ion flight times and of the ion flight paths. The time and place focusing of the ions hereby achieved means for time-of-flight mass spectrometers high mass resolution capability and high transmissions.

10 Claims, 4 Drawing Sheets

ION REFLECTOR

Figure 1A:
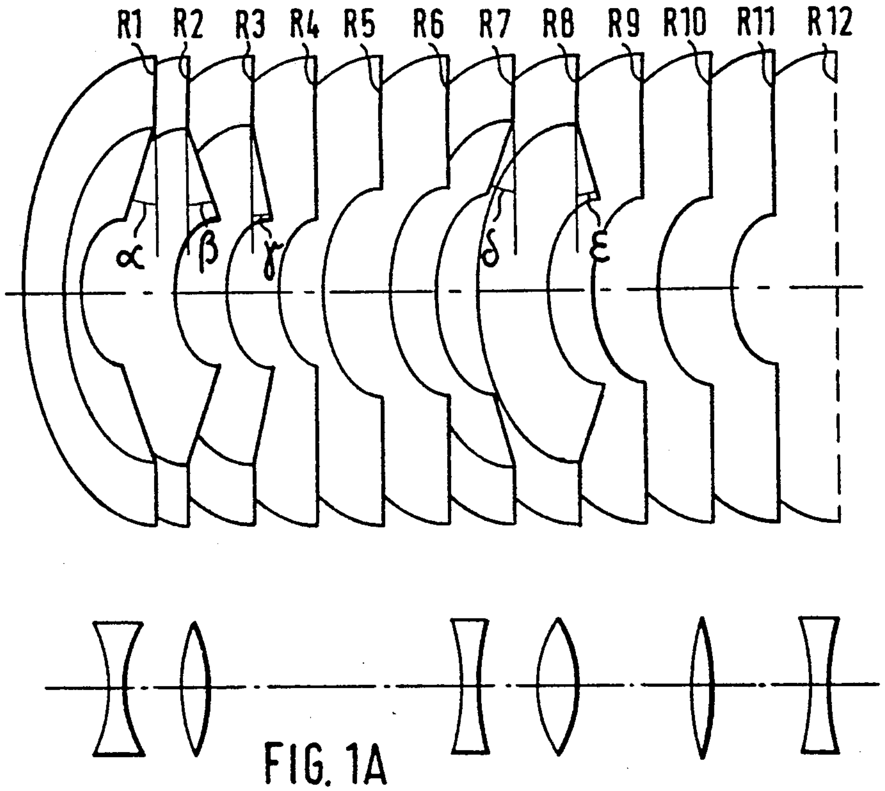

The invention is concerned with an ion reflector having a number of electrodes which are arranged in a number of planes one behind the other in the direction of the ion radiation.

Ion reflectors are suitable in particular for use in time-of-flight mass spectrometers. Time-of-flight mass spectrometers with grid-electrode ion reflectors or else gridfree ion reflectors are already known from the U.S. Pat. No. 4,731,532.

In time-of-flight mass spectrometry ion reflectors serve more especially the aim of improved mass resolution. This is achieved by the fact that faster ions penetrate deeper into the ion reflector and must therefore cover longer flight paths so that the total time of flight of the ions in a time-of-flight mass spectrometer becomes to a certain extent energy-independent. Consequently an ion reflector can reflect the original pulse length of the ions which is generated by the ion source, at about the same magnitude.

Ion reflectors with grid electrodes nevertheless have here the disadvantage that both because of the area of the grid bars and because of the inhomogeneous electrical field in the neighbourhood of the grid bars, their transmission becomes drastically reduced. This is one of the reasons for the development of ion reflectors with gridfree electrodes.

The problem underlying the invention, in the case of an ion reflector of the species specified initially with grid electrodes or with gridfree electrodes, is to improve the ion-optical properties.

The ion reflectors in accordance with the invention, because of their outer shape and with correspondingly appropriate potentials at the electrodes, have improved ion-optical properties. In particular with the electrodes of the ion reflector in accordance with the invention made conical the equipotential lines can be directed with considerably greater precision than in the case of simple aperture or cylinder electrodes arranged in parallel even if these have different diameters. The shape and density distribution of the equipotential lines are hereby decisively influenced, which determine the lens properties. In cooperation with the other potentials matched to them, which likewise generate again an in-homogeneous field, these lead to an ion reflector which is considerably improved in its longitudinal and transverse reflective properties.

The good time-reflective properties of such ion reflectors come about through an optimum compensation of the chromatic as well as the spherical aberrations of the ion flight-times. Even in the case of large energy spreads of the ions and for relatively large ion beam cross-sections (referred to the aperture diameter of the ion reflector) a high mass resolution capability is thereby achieved.

But at the same time the spherical and chromatic lateral aberrations for the flight paths of the ions are also held to an optimum low. This means that the ion reflector in accordance with the invention can have decidedly good transverse focusing properties (space-focusing) with at the same time high angular acceptance for the ions, large ion beam cross-sections as well as large energy spreads of the ions. Hence an "illumination" of the ion reflector is possible; that means, the reflection of an ion beam with a large phase volume at high transmission. Through these space-focusing properties the ion reflector in accordance with the invention may in general be used as an ion-optical element even for continuous ion beams.

Preferably in the case of the ion mirror in accordance with the invention conically constructed electrodes are employed altogether or in partial zones. But also electrodes may be used with similar success, which project obliquely altogether or in a partial zone in another way out of the respective electrode plane, for example, by the electrodes exhibiting hollow zones like the shell of a truncated pyramid. In that case the essentially oblique zones of the electrode or electrodes may also be made slightly arched.

The potentials at the electrodes of the ion reflector in accordance with the invention may also be so dimensioned that in the middle and rear zones of the ion reflector they generate an approximately homogeneous electrical field. But a suitable non-linear potential trend may with about equally good time and space focussing properties of the ion reflector, shorten its structural length considerably.

It is also possible to combine ion reflectors in accordance with the invention with one another in such a way that the ions through multiple reflections can cover a long flight path, in which case here the good lateral focusing properties of the ion reflectors hold the loss in intensity within limits. Long ion flight times are thereby achieved with ion pulse lengths at the detector, which are of a similar magnitude to the original pulse lengths of the ions from the ion source.

Moreover an ion reflector in accordance with the invention may be so set that the focal length for high ion energy is shorter than for ions of lower energy. Exactly the opposite holds for the focal lengths of unit lenses so that in the case of a combination of ion reflector and unit lens its chromatic aberration may be compensated. This means that the transverse focusing properties of such an achromatic complete system are within a certain range of energy, independent of the ion energy.

If in the main it is only the space focusing properties of the ion reflector in accordance with the invention which are needed, it may even consist of only two electrodes (see Example 3).

Figure 1B:
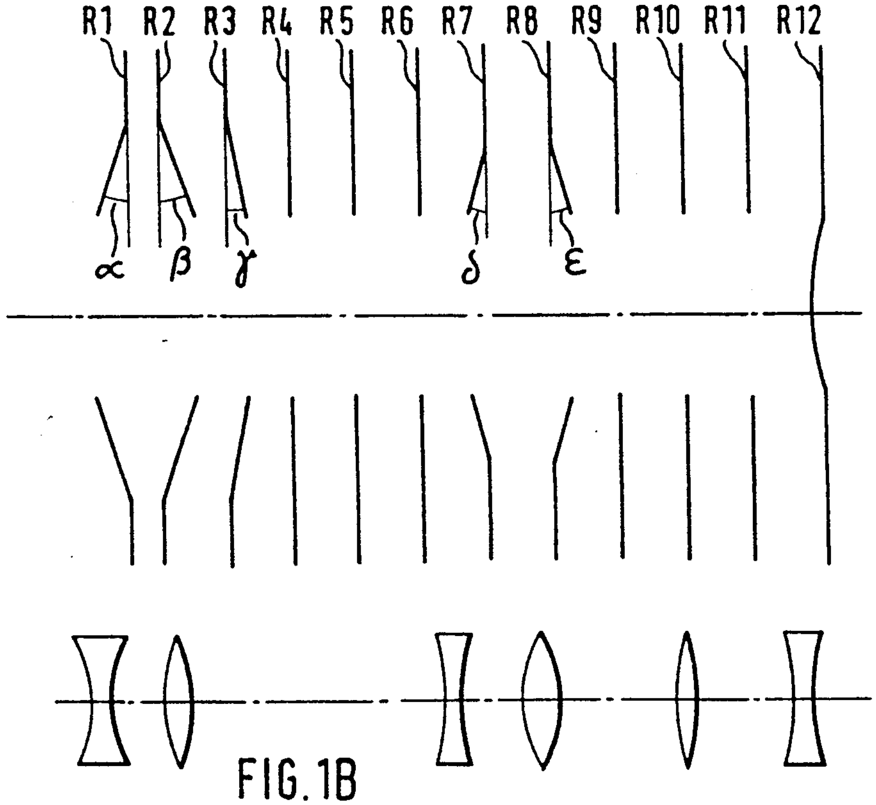
Figure 2:
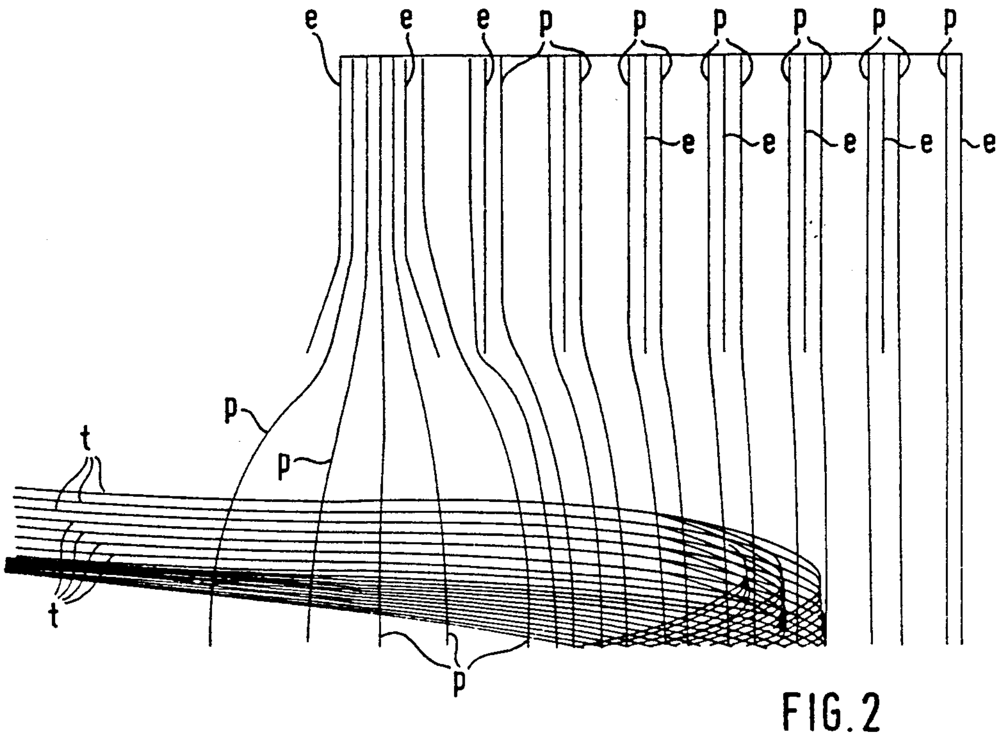
Figure 6:
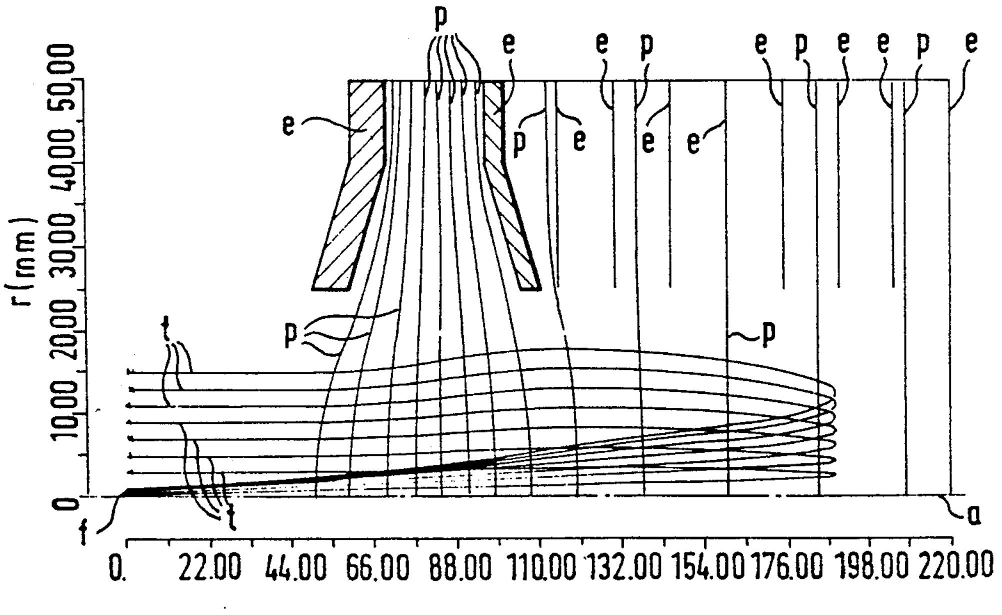
Figure 3A:
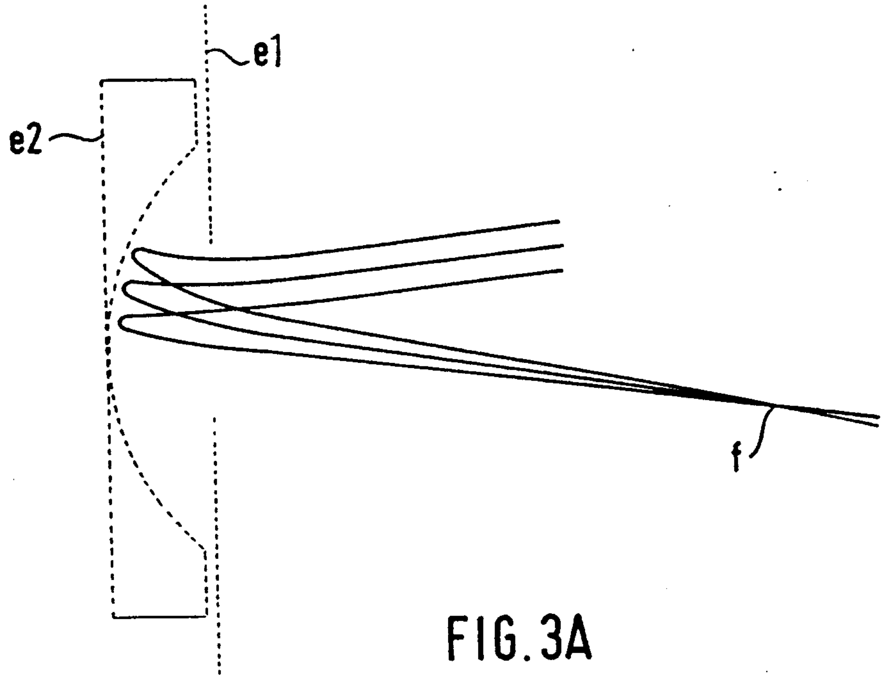
Figure 3B:
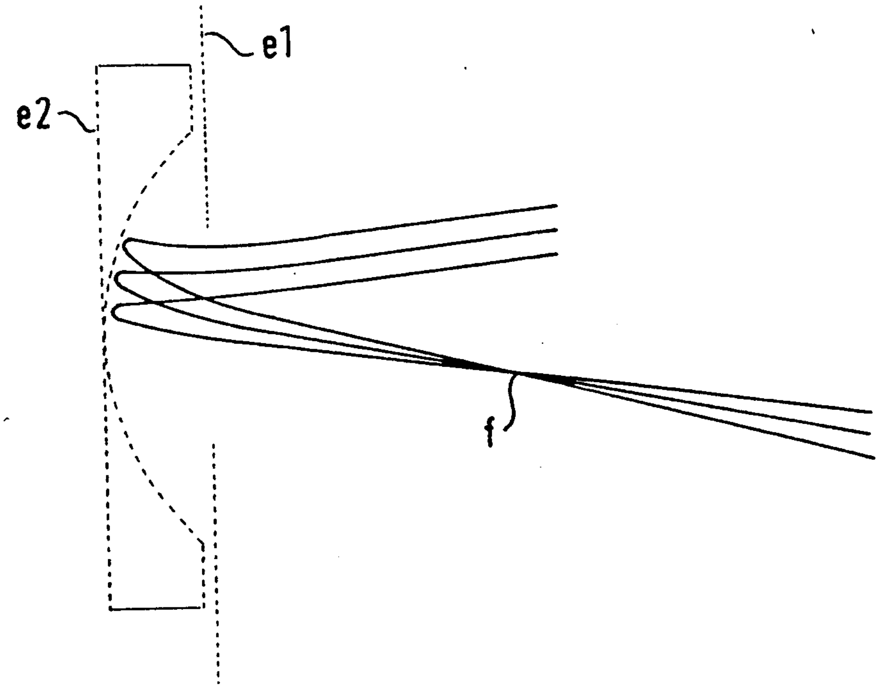
Figure 4:
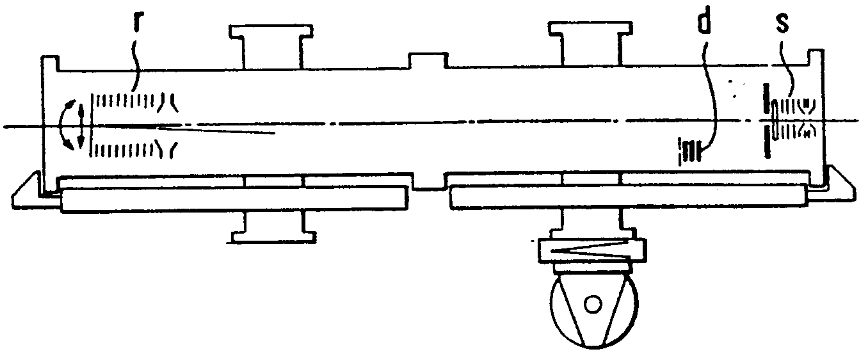
Figure 5:
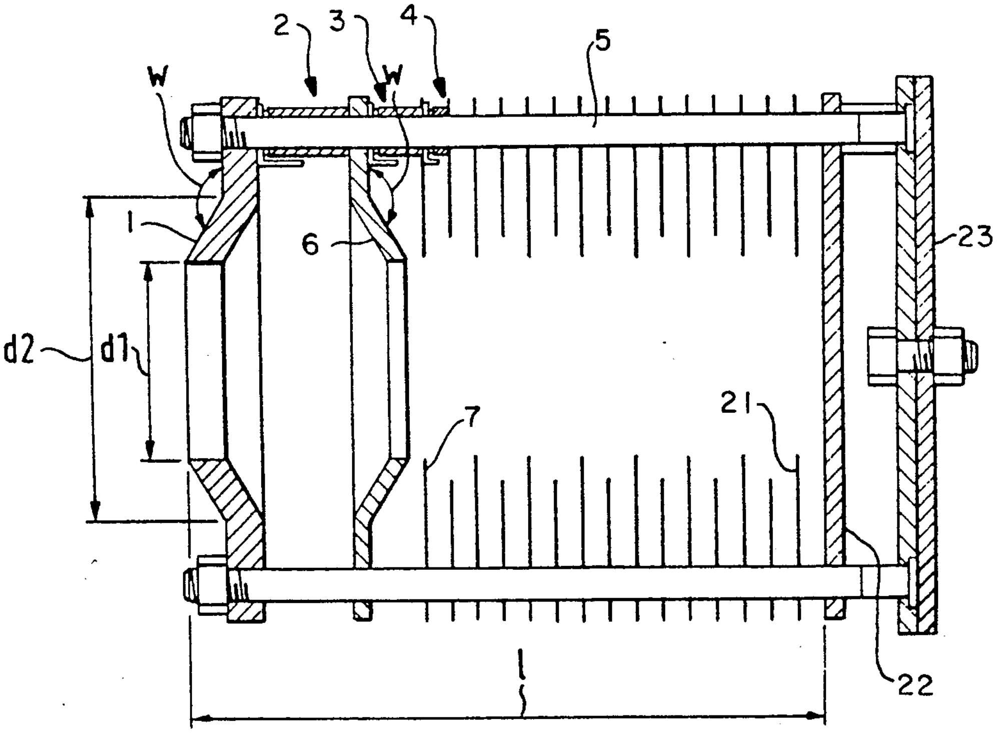

Embodiments from which further inventive features follow are represented in the drawing. There is shown in:

FIG. 1A—a first embodiment of an ion reflector in accordance with the invention in diagrammatic longitudinal section;

FIG. 1B—a second embodiment of an ion reflector in accordance with invention, likewise in diagrammatic longitudinal section;

FIG. 2—a diagrammatic representation of a partial zone of a third embodiment of an ion reflector in accordance with the invention with calculated ion flight paths;

FIGS. 3A and 3B—a diagrammatic representation of a fourth embodiment of a space-focusing ion reflector in accordance with the invention, of two electrodes;

FIG. 4—the fundamental construction of a time-of-flight mass spectrometer with an ion reflector in accordance with the invention;

FIG. 5—a fifth embodiment of an ion reflector in accordance with the invention, in longitudinal section; and FIG. 6—a partial zone of a sixth embodiment of an ion reflector in accordance with the invention, in longitudinal section with calculated ion flight paths.

EXAMPLE 1

In the embodiments in accordance with FIG. 1 (FIGS. 1A and 1B) ion reflectors having a number of focusing stages are represented diagrammatically, and underneath them the transverse focusing and defocusing zones. The potentials on the electrodes R1 to R12 generate a non-linear potential gradient which flattens towards the rear of the ion reflectors. Such distributions of potential have a focusing effect and may if necessary be corrected by defocusing elements. These may be realized through appropriate potentials on the electrodes R11 and R12 (FIG. 1A) or by conically shaped electrode geometries of the electrodes R11 and R12, or equally well through spherically or paraboloidally curved surfaces of the terminal electrode R12 as represented in FIG. 1B. The angles $\alpha$ to $\epsilon$ may assume values between 0° and 360°.

EXAMPLE 2

In FIG. 2 the calculated ion flight paths (trajectories t) and equipotential lines p of electrodes e are plotted for a time- and space-focusing ion reflector. The ions have three different energies with a relative energy spread of 10% and fall as a parallel beam on the ion reflector and as the ion flight paths t clearly show, become focused transversely in one focal point at some distance in front of the ion reflector (outside the range of the Figure). The relative differences in flight time of the ions amount to 0.00005, inclusive of the fieldfree drift sections.

EXAMPLE 3

The ion reflector shown in FIG. 3 (FIGS. 3A and B) is built up of only two electrodes e1 and e2 and has preponderantly space-focusing properties. Through the high refractive power of the ion reflector lens the focal points f lie a short way in front of the ion reflector. The shorter focal lengths hold for the higher ion energies.

EXAMPLE 4

In FIG. 4 the basic construction of a time-of-flight mass spectrometer is represented, with the experimental arrangement of ion source s, ion reflector r and ion detector d. The ion reflector r is mounted upon a flange on which there are also the leads through for the electric supply to the reflector electrodes. The vacuum needed should exhibit a pressure less than $5 \times 10^{-5}$ hPa.

FIG. 5 shows a further embodiment of an ion reflector in accordance with the invention. Upon a baseplate 23 of the ion reflector are mounted three electrically insulating carrier rods 5 of reticulated polystyrene, over which the axially symmetrical electrodes 1, 6 and 7 to 22 are slipped.

All of the electrodes are manufactured from stainless steel, the wall thickness of the cone electrode 1 amounting to 10 mm, that of the cone electrode 6 to 5 mm and that of the electrodes 7 to 21 to 0.5 mm. Between the electrodes there is in each case an arrangement of sheet-metal screen, insulating ring (Teflon) and metal tube (steel or brass) as shown by way of example in FIG. 5 by 2, 3 and 4. The distances between the individual electrodes from electrode 7 over to the terminal electrode 22 amount in each case to 7 mm. The distance between the cone electrode 6 and the electrode 7 amounts to 15 mm, the distance between the cone electrode 1 and the cone electrode 6 amounts to 25 mm. The apertures through the cone electrodes 1 and 6, which at the same time are the smaller radial diameters d1 of the cones, have a diameter of 50 mm, the larger radial diameters d2 of the cones amounting to 81 mm. The angle w between the electrode plane and the cone of each cone electrode amounts to 147°.

The diameter of the ion reflector, measured between two longitudinal axes of carrier rods 5 amounts to 115 mm, the length 1 from the front face of the cone electrode 1 to the front face of the terminal electrode 22 amounts to 170 mm. The outside diameter of each electrode amounts to 132 mm.

The electrode potentials for ions of a kinetic energy of 450 eV (relative energy spread up to about 10%, range of apex angle of the incident ion bundles up to 1.4°) read as follows:

| Electrode | 1 | 6 | 7 | 8 | 9 | 10 | 11 | 12 | 13 | 14 | 15 | 16 | 17 | 18 | 19 | 21 | 22 |
|---|---|---|---|---|---|---|---|---|---|---|---|---|---|---|---|---|---|
| Potential/V | 0 | 285 | 293 | 311 | 331 | 351 | 368 | 383 | 395 | 404 | 412 | 420 | 431 | 445 | 461 | 479 | 500 |

In the plot according to FIG. 6 calculated equipotential lines p of electrodes e and ion flight paths t are shown for an ion reflector in accordance with the invention.

In this Figure only the upper half of the plane of section through the ion reflector is represented. Through rotation of this Figure about the optical axis a the ion reflector may be represented three-dimensionally with equipotential lines p and ion flight paths t.

The potentials belonging to the equipotential lines p amount to 20 V, 40 V, 80 V, 120 V, etc. in steps of 40 V upwards. The ion energy amounts to 450 eV. As may be learned from FIG. 6, in spite of high illumination of the ion reflector, the ions from here of uniform energy are focused transversely with only low spherical aberrations. The time-of-flight calculations yield in this focal point f at the same time also a longitudinal focal point.

In FIG. 6 scales for the radial spread r and the length z of the ion reflector are plotted in millimeters.

What is claimed is:

1. An ion reflector for a time-of-flight mass spectrometer having a number of electrodes which are arranged in a number of planes one behind the other in the direction of the ion propagation for providing longitudinal focusing characterized in that at least one of the electrodes is substantially in the shape of a truncated cone with the smaller end of the cone forming a grid free aperture through which said ions are propagated, said at least one electrode providing an inhomogeneous electric field for transverse focusing, as well as longitudinal focusing, while minimizing spherical and chromatic lateral aberrations.

2. An ion reflector as in claim 1 characterized by said one electrode including a flat apertured diaphragm with a truncated cone fastened to such apertured diaphragm.

3. An ion reflector as in claim 2 characterized in that said cone and the apertured diaphragm are manufactured in one piece.

4. An ion reflector as in claim 1 characterized in that said one electrode is in the shape of a truncated pyramid with partially plane areas being provided and where the opening in the smaller end may be round; square or rectangular.

5. An ion reflector, as in claim 1 characterized in that individual electrodes are insulated electrically from one another allowing different electrical potentials.

6. An ion reflector as in claim 1 characterized in that the first one, two or three electrodes at the open side of the ion reflector are formed as cone electrodes.

7. An ion reflector as in claim 6 characterized in that every other electrode which is not made conical is either an aperture-diaphragm electrode or a cylinder or grid electrode or a combination of these.

8. An ion reflector as in claim 7 characterized in that some of the diameters of the openings in the individual electrodes are different.

9. An ion reflector as in claim 1 characterized in that the potentials of the electrodes are so chosen that a substantially inhomogeneous electrical field arises in the whole ion reflector.

10. An ion reflector as in claim 1 characterized by a rear electrode which is substantially spherically, ellipsoidally or parabolically curved.

* * * * *